USOO5750031A

United States Patent [19]
Rahman et al.

[11] Patent Number: 5,750,031
[45] Date of Patent: May 12, 1998

[54] PROCESS FOR PRODUCING SURFACTANT HAVING A LOW METAL ION LEVEL AND DEVELOPER PRODUCED THEREFROM

[75] Inventors: M. Dalil Rahman, Flemington, N.J.; Daniel P. Aubin, Voluntown, Conn.

[73] Assignee: Clariant Finance (BVI) Limited, Virgin Islands (Br.)

[21] Appl. No.: 533,828

[22] Filed: Sep. 26, 1995

[51] Int. Cl.$^6$ .................................. B01D 15/04
[52] U.S. Cl. .................... 210/681; 210/683; 210/685; 430/331
[58] Field of Search .................... 430/331, 168, 430/169; 210/660, 661, 681, 683, 685, 686

[56] References Cited

U.S. PATENT DOCUMENTS

| | | | |
|---|---|---|---|
| 2,929,808 | 4/1960 | Ross et al. | 260/94.9 |
| 4,033,909 | 7/1977 | Papa | 260/482 |
| 4,033,910 | 7/1977 | Papa | 260/25 F |
| 4,195,138 | 3/1980 | Ward | 525/404 |
| 4,250,031 | 2/1981 | Uejima et al. | 210/688 |
| 4,452,883 | 6/1984 | Frenchik et al. | 430/502 |
| 4,567,130 | 1/1986 | Held | 430/294 |
| 4,584,261 | 4/1986 | Held | 430/294 |
| 4,636,540 | 1/1987 | Warfel | 523/310 |
| 4,721,665 | 1/1988 | Dooley et al. | 430/270 X |
| 4,747,954 | 5/1988 | Vaughn et al. | |
| 4,784,937 | 11/1988 | Tanaka et al. | 430/331 |
| 4,833,067 | 5/1989 | Tanaka et al. | 430/331 |
| 4,914,006 | 4/1990 | Kato et al. | 430/331 |
| 5,073,622 | 12/1991 | Wojtech et al. | 528/486 |
| 5,116,715 | 5/1992 | Roland | 430/190 |
| 5,118,787 | 6/1992 | Furuno | 528/482 |
| 5,175,078 | 12/1992 | Aoyama et al. | 430/331 |
| 5,212,044 | 5/1993 | Liang et al. | 430/270 X |
| 5,230,988 | 7/1993 | Akiyama et al. | 430/331 |
| 5,284,930 | 2/1994 | Matsumoto et al. | 528/482 |
| 5,286,606 | 2/1994 | Rahman et al. | 430/311 |
| 5,300,628 | 4/1994 | Honda | 528/482 |
| 5,350,714 | 9/1994 | Trefonas, III et al. | 210/663 X |
| 5,378,802 | 1/1995 | Honda | 210/660 X |
| 5,446,125 | 8/1995 | Honda et al. | 528/486 |
| 5,472,616 | 12/1995 | Szmanda et al. | 210/683 |
| 5,476,750 | 12/1995 | Rahman et al. | 430/270 |
| 5,500,127 | 3/1996 | Carey et al. | 210/685 |
| 5,516,886 | 5/1996 | Rahman et al. | 528/482 |
| 5,521,052 | 5/1996 | Rahman et al. | 430/270.1 |
| 5,543,263 | 8/1996 | Rahman et al. | 430/168 |

FOREIGN PATENT DOCUMENTS

| | | |
|---|---|---|
| 544324 | 6/1993 | European Pat. Off. |
| 544325 | 6/1993 | European Pat. Off. |
| A-0588492 | 3/1994 | European Pat. Off. |
| 1072155 | 3/1989 | Japan |
| 1-228560 | 9/1989 | Japan |
| 4-65415 | 3/1992 | Japan |
| 1509354 | 5/1978 | United Kingdom |
| WO 90/01726 | 2/1990 | WIPO |
| WO 93/12152 | 6/1993 | WIPO |
| WO 93/18437 | 9/1993 | WIPO |
| WO 94/01807 | 1/1994 | WIPO |
| WO 94/12912 | 6/1994 | WIPO |
| WO 94/14858 | 7/1994 | WIPO |
| WO 94/14863 | 7/1994 | WIPO |
| WO 96/12214 | 4/1996 | WIPO |
| WO 96/20965 | 7/1996 | WIPO |
| WO 96/21175 | 7/1996 | WIPO |
| WO 96/21176 | 7/1996 | WIPO |
| WO 91/12280 | 4/1997 | WIPO |
| WO 97/11929 | 4/1997 | WIPO |
| WO 97/12281 | 4/1997 | WIPO |
| WO 97/19969 | 6/1997 | WIPO |

OTHER PUBLICATIONS

Rohm and HAAS Company; "Amberlite Ion Exchange Resins Laboratory Guide"; Sep. 1979; Philadelphia, PA.

JP–A–1190713 Inatomi, Shigeki et al, Jul. 31, 1989; Chemcial Abstracts, vol. 112, No. 18, Apr. 30, 1990, Columbus, OH, p. 17, the Abstract 159201u.

G. Noti et al, "Deionized Water Plants for Semiconductor Device Fabrication", Proceedings of the Inst:Radio and Electron. Eng. Aust.(Australia), vol. 34, No. 2, Mar. 1973, pp. 45–51.

Derwent Publications Ltd., London, GB; JP–A–05 234 876 (OCG Microelectronic Materials), Sep. 10, 1993.

Kimura et al; "Purification of Formaldehyde"; Mar. 9, 1977; CA87(7):52776y.

T. Tanada; "A New Photolithography Tech. with Antireflective . . . "; Journal of the Electrochemical Society, vol. 137, No. 12, pp. 393900–393905; Dec. 1990, Manchester, New Hampshire.

Bayard; "Water Free of Heavy Metals for Medical Use and Ion Exchange Resin Used in its Preparation" Nov. 16, 1992; CA98(26):221589z.

Hirai et al. "Treatment of Waste Waters Containing Formaldehyde and Metals with Chelating Ion Exchange Resins"; Nov. 5, 1975; CA84(14):95328j.

*Primary Examiner*—John S. Chu
*Attorney, Agent, or Firm*—Andrew F. Sayko, Jr.

[57] ABSTRACT

The present invention provides a process for producing a developer containing a surfactant which contains a very low level of metal ions.

8 Claims, No Drawings

PROCESS FOR PRODUCING SURFACTANT HAVING A LOW METAL ION LEVEL AND DEVELOPER PRODUCED THEREFROM

BACKGROUND OF THE INVENTION

The present invention relates to a process for producing a surfactant having a low level of metal ions, especially sodium and iron, producing a developer having a very low level of metal ions.

Photoresist compositions are used in microlithography processes for making miniaturized electronic components such as in the fabrication of computer chips and integrated circuits. Generally, in these processes, a thin coating of film of a photoresist composition is first applied to a substrate material, such as silicon wafers used for making integrated circuits. The coated substrate is then baked to evaporate any solvent in the photoresist composition and to fix the coating onto the substrate. The baked coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the photoresist and all of the anti-reflective coating from the surface of the substrate.

Metal contamination has been a problem for a long time in the fabrication of high density integrated circuits and computer chips, often leading to increased defects, yield losses, degradation and decreased performance. In plasma processes, metals such as sodium and iron, when they are present in the photoresist or in a coating on the photoresist, can cause contamination especially during plasma stripping. However, these problems have been overcome to a substantial extent during the fabrication process, for example, by utilizing HCl gathering of the contaminants during a high temperature anneal cycle.

As semiconductor devices have become more sophisticated, these problems have become much more difficult to overcome. When silicon wafers are coated with a liquid positive photoresist and subsequently stripped off, such as with oxygen microwave plasma, the performance and stability of the semiconductor device is often seen to decrease. As the plasma stripping process is repeated, more degradation of the device frequently occurs. The cause of such problems can be the metal contamination in the (i) photoresist, (ii) anti-reflective coating on the wafer, and (iii) developer. Metal levels of less than 1.0 ppm can adversely affect the properties of such semiconductor devices. Surfactants are used as coating additives in photoresists, as well as additives in developer solutions. Various kinds of surfactants are applied to formulate the developer by mixing with a developer such as an aqueous tetramethyl ammonium hydroxide solution.

There are two types of photoresist compositions, negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to such a solution. Thus, treatment of an exposed negative-working resist with a developer causes removal of the non-exposed areas of the photoresist coating and the creation of a negative image in the coating. Thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble in the developer solution (e.g. a rearrangement reaction occurs) while those areas not exposed remain relatively insoluble in the developer solution. Thus, treatment of an exposed positive-working photoresist with the developer causes removal of the exposed areas of the coating and the creation of a positive image in the photoresist coating. Again, a desired portion of the underlying substrate surface is uncovered.

After this development operation, the now partially unprotected substrate may be treated with a substrate-etchant solution or plasma gases and the like. The etchant solution or plasma gases etch that portion of the substrate where the photoresist coating was removed during development. The areas of the substrate where the photoresist coating still remains are protected and, thus, an etched pattern is created in the substrate material which corresponds to the photomask used for the image-wise exposure of the radiation. Later, the remaining areas of the photoresist coating may be removed during a stripping operation, leaving a clean etched substrate surface. In some instances, it is desirable to heat treat the remaining photoresist layer, after the development step and before the etching step, to increase its adhesion to the underlying substrate and its resistance to etching solutions.

Positive working photoresist compositions are currently favored over negative working resists because the former generally have better resolution capabilities and pattern transfer characteristics. Photoresist resolution is defined as the smallest feature which the resist composition can transfer from the photomask to the substrate with a high degree of image edge acuity after exposure and development. In many manufacturing applications today, resist resolution on the order of less then one micron are necessary. In addition, it is almost always desirable that the developed photoresist wall profiles be near vertical relative to the substrate. Such demarcations between developed and undeveloped areas of the resist coating translate into accurate pattern transfer of the mask image onto the substrate.

SUMMARY OF THE INVENTION

The present invention relates to a process for producing a surfactant containing a very low level of metal ions, especially sodium and iron, and for producing a developer containing such a surfactant.

The process of the subject invention provides a developer containing such a surfactant and having a very low level of metal ions. The developer is applied to wash out the undesired area of a photoresist coating on the wafer, which photoresist may be either negative or positive working, although positive photoresists are preferred.

The surfactant obtained has a very low levels of metal ions such as iron, sodium, potassium, calcium, magnesium, copper and zinc. Sodium and iron are the most common metal ion contaminants and among the easiest to detect. The level of these metal ions serves as an indicator of the level of other metal ions. The level of sodium and iron ions, are each respectively, less than 20,000 ppb, preferably less than 7,000 ppb, more preferably less than 1,000 ppb, and most preferably less than 500 ppb each.

The present invention provides a process for producing a surfactant, preferably ammonium lauryl sulfate, having a very low level of metal ions, particularly sodium and iron and to a process for producing a developer containing such surfactant. In the preferred embodiment, the process utilizes an acidic ion exchange resin to purify the surfactant and the developer. The subject process comprises:

a) washing an acidic ion exchange resin with deionized (DI) water, followed by a mineral acid solution (e.g. a 5–98% solution of sulfuric, nitric or hydrochloric acid) to reduce the level of sodium and iron ions in the ion exchange resin to less than 200 ppb, preferably less than 100 ppb, more preferably less than 50 ppb and most preferably no more than 20 ppb each;

b) providing a solution of 1 to 35 weight percent of surfactant, preferably ammonium lauryl sulfate, in a deionized solvent, such as deionized water;

c) passing the surfactant solution through the acidic ion exchange resin and thereby reducing the level of sodium and iron ions in the solution to no more than 20,000 ppb each, preferably less than 7,000 ppb, more preferably less than 1000 ppb, and most preferably less than 500 ppb each;

d) adding an aqueous base, such as an ammonium hydroxide to the deionized solution to adjust pH to 7to 8.

e) formulating a developer composition by providing an admixture of:
  (1) the acidic ion exchange resin treated surfactant solution in a suitable deionized solvent (adjust the concentration by adding more of the same solvent, such as deionized water);
  (2) mixing the surfactant solution with a suitable metal ion free developer, such as an ammonium hydroxide, preferably tetramethyl ammonium hydroxide (TMAH).

Prior to the acidic ion exchange resin treating of the surfactant solution component, the ion exchange resin is treated with a solvent which is the same as, or at least compatible with, the solvent for the component or mixture of components which is to be treated with the ion exchange resin. Preferably, the ion exchange resin is treated with sufficient new solvent to substantially remove other solvents and to saturate the ion exchange resin with the new solvent.

The present invention provides a process for producing a surfactant having a very low level of metal ions, particularly sodium and iron. It also provides a process for producing a developer from such surfactant. The preferred process utilizes an acidic ion exchange resin to purify the surfactant and the developer. The subject preferred process comprises:

a) washing an acidic ion exchange resin with deionized water, followed by a mineral acid solution (e.g. a 5–98% solution of sulfuric, nitric or hydrochloric acid) followed by rinsing with DI water to reduce the level of conductivity to 18 mega ohms and the level of sodium and iron ions in the acidic ion exchange resin to less than 200 ppb each, preferably less than 100 ppb, more preferably less than 50 ppb and most preferably no more than 20 ppb each; washing the ion exchange resin bed with an ammonium hydroxide solution (1 to 28% ), such as 1–28% ammionium hydroxide or 1–14% tetramethyl ammonium hydroxide;

b) providing a solution of 1 to 35 weight percent of surfactant in a deionized solvent, such as deionized water;

c) passing the surfactant solution through the acidic ion exchange resin and thereby reducing the level of sodium and iron ions in the solution to no more than 20,000 ppb each, preferably less than 7,000 ppb, more preferably less than 1,000 ppb, and most preferably less than 500 ppb each;

d) adding ammonium hydroxide to the deionized solution to adjust pH to 7to 8;

e) formulating a developer composition by providing an admixture of:
  (1) the acidic ion exchange resin treated surfactant solution in a suitable deionized solvent (adjust the concentration by adding more of the same solvent, such as deionized water);
  (2) mixing the ammonium lauryl sulphate solution with a suitable metal ion free developer, such as an ammonium hydroxide, preferably tetramethyl ammonium hydroxide (TMAH).

Prior to the ion exchange resin treating of the surfactant solution component, the ion exchange resin is treated with a solvent which is the same as, or at least compatible with, the solvent for the component or mixture of components which is to be treated with the ion exchange resin. Preferably, the ion exchange resin is treated with sufficient new solvent to substantially remove other solvents and to saturate the ion exchange resin with the new solvent.

During the deionization of ammonium lauryl sulphte solution with acidic ion exchange resin, ammonium ion is exchanged with protons of acidic ion exchange to convert ammonium lauryl sufphate to lauryl sulphate. The acidic ion exchange is also converted to ammonium salt. It is necessary to reactivate the acidic ion exchange to continue deionization. If the metal contamination is high in lauryl sulfphate, this can be treated with acidic ion exchange resin to reduce metals.

An acidic ion exchange resin, such as a styrene/divinylbenzene cation exchange resin, is utilized in the present process. Such ion exchange resins are available from Rohm and Haas Company. e.g. AMBERLYST® 15 resin and Bio Rad® resin, e.g. Analytical Grade 50W-X12, 50W-X8 or 50W-X4. These resins typically contain as much as 80,000 to 200,000 ppb each of sodium and iron. Before being utilized in the process of the present invention, the ion exchange resin must be treated with water and then a mineral acid solution to reduce the metal ion level. Preferably the ion exchange resin is initially rinsed with deionized water, followed by a mineral acid solution, such as a 10 percent sulfuric acid solution, rinsed again with deionized water, treated again with the mineral acid solution and once more rinsed with deionized water.

The solution of surfactant is passed through a suitable vessel, such as a column, containing the ion exchange resin, e.g. a solution of from about 1 to 40 weight percent in a suitable solvent. Such solutions may typically contain from 500 to 180,000 ppb each of sodium, iron and potassium ions. During the process of the present invention, these levels are each reduced to as low as >10 ppb each.

The present invention provides a process for producing a developer having a very low level of metal ions and a process for producing semiconductor devices using such a developer for developing a photoresist. The developer is formulated by mixing a deionized surfactant solution and a metal ion free base, such as tetramethyl ammonium hydroxide.

The preferred solvent is deionized water. Other suitable solvents include ethanol and ethanol/water mixtures. The solvent may be present in the overall composition in an amount of up to about 95% by weight of the solids in the composition.

Any desired photoresist can be applied to a substrate by any conventional method used in the photoresist art, including dipping, spraying, whirling and spin coating. When spin coating, for example, the photoresist solution can be adjusted with respect to the percentage of solids content, in order to provide coating of the desired thickness, given the type of spinning equipment utilized and the amount of time allowed for the spinning process. Suitable substrates include silicon, aluminum, polymeric resins, silicon dioxide, doped silicon dioxide, silicon nitride, tantalum, copper, polysilicon, ceramics, aluminum/copper mixtures; gallium arsenide and other such Group III/V compounds.

The photoresist composition is coated onto the substrate and the substrate is treated at a temperature from about 70° C. to about 120° C. for from about 30 seconds to about 180 seconds on a hot plate or for from about 15 to about 90 minutes in a convection oven. This temperature treatment is selected in order to reduce the concentration of residual solvents in the photoresist and anti-reflective coating, while not causing substantial thermal degradation of the photo-sensitizer. In general, one desires to minimize the concentration of solvents and this first temperature treatment is conducted until substantially all of the solvent has evaporated and a thin coating of photoresist composition, on the order of one micron in thickness, remains on the substrate. The treatment is conducted until the rate of change of solvent removal becomes relatively insignificant. The temperature and time selection depends on the photoresist properties desired by the user, as well as the equipment used and commercially desired coating times. The coating substrate can then be exposed to actinic radiation, e.g. ultraviolet radiation (at a wavelength of from about 300 nm (nanometers) to about 450 nm (nanometers)), x-ray, electron beam, ion beam or laser radiation, in any desired pattern, produced by use of suitable masks, negatives, stencils, templates, etc.

The substrate is then optionally subjected to a post exposure second baking or heat treatment either before or after development. The heating temperatures may range from about 90° C. to about 120° C. The heating may be conducted for from about 30 seconds to about 2 minutes, more preferably from about 60 seconds to about 90 seconds on a hot plate or about 30 to about 45 minutes by convection oven.

The exposed photoresist-coated substrates are developed by using an ion exchange resin treated developer to remove the image-wise exposed areas by immersion in a developing solution, or developed by a spray development process. The solution is preferably agitated, for example, by nitrogen burst agitation. The substrates are allowed to remain in the developer until all, or substantially all, of the photoresist coating has been dissolved from the exposed areas. Developers may include aqueous solutions of ammonium hydroxides. One especially preferred hydroxide is tetramethyl ammonium hydroxide.

After removal of the coated wafers from the developing solution, one may conduct an optional post-development heat treatment or bake to increase the coating's adhesion and chemical resistance to etching solutions and other substances. The post-development heat treatment can comprise the oven baking of the coating and substrate at a temperature below the coating's softening point. In industrial applications, particularly in the manufacture of microcircuitry units on silicon/silicon dioxide-type substrates, the developed substrates may be treated with a buffered, hydrofluoric acid base etching solution.

The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLE 1

AMBERLYST® 15 acidic ion exchange resin beads were placed in a conical flask and deionized water was added so that all of the resin beads were under water. The flask were sealed and allowed to stand overnight to swell the resin beads. The next morning the water was decanted, deionized water was again added to cover the resin beads and the flask was shaken slowly. The water was again decanted. The rinsing with deionized water and decanting steps were repeated three more times. The resulting slurry of acidic ion exchange resin was poured into a glass column equipped with a porous disk and a stopcock. The resin was allowed to settle to the bottom and the column was back flushed with deionized water for 25 minutes. The resin was again allowed to settle to the bottom. The bed volume was measured as 120 ml. A 10 percent sulfuric acid solution (6 bed volumes) was passed down through the resin bed at a rate of about 12 ml. per minute. Deionized water (60 bed vol.) was then allowed to pass down through the resin bed at about the same rate. The pH of the effluent water was measured to assure that it matched the pH of 6 for fresh deionized water.

Ammonium lauryl sulphate (ALS) solution in water(26% solid) containing about 300,000 ppb of sodium, 100 ppb of potassium, 1000 ppb of iron, 100 ppb of Chromium, and 100 ppb of Copper, was passed through the column at the same rate. The cleaned material obtained had 158 ppb of sodium, 84 ppb of potassium, 43 ppb of iron, 20 ppb of chromium, and 49 ppb of copper.

EXAMPLE 2

Example 1 was repeated and the following results were obtained.

| Metals (ppb) | Deionized (26%) |
| --- | --- |
| Na | 45 |
| K | 22 |
| Fe | 9 |
| Cr | 65 |
| Cu | 8 |
| Ca | 125 |

EXAMPLE 3

AMBERLYST® 15 acidic ion exchange resin beads were placed in a conical flask and deionized water was added so that all of the resin beads were under water. The flask were sealed and allowed to stand overnight to swell the resin beads. The next morning the water was decanted, deionized water was again added to cover the resin beads and the flask was shaken slowly. The water was again decanted. The rinsing with deionized water and decanting steps were repreated three more times. The resulting slurry of acidic ion exchange resin was poured into a glass column equipped with a porous disk and a stopcock. The resin was allowed to settle to the bottom and the column was back flushed with deionized water for 25 minutes. The resin was again allowed to settle to the bottom, the bed volume was measured as 130 ml. A 10 percent sulfuric acid solution (6 bed volumes) was passed down through the resin bed at a rate of about 12 ml. per minute. Dieonized water (60 bed vol.) was then allowed to pass down through the resin bed at about the same rate.

The pH of the effluent water was measured to assure that it matched the pH of 6 for fresh deionized water. Two bed volumes of 14% ammonium hydroxide solution in water was passed through the column, followed by 6 bed volumes of deionized water.

Ammonium lauryl sulphate in water (15%) containing over 1000 ppb Na, 209 ppb Fe and 218 ppb of Zn was passed through the column. The cleaned material obtained had 202 ppb Na, 383 ppb Fe and 6 ppb Zn.

EXAMPLE 4

A canister containing 114 lbs of Amberlyst® 15 acidic ion exchange resin (total bed volume 3 cu ft, 84 liters), was processed according to the following procedure: A 10 percent (10%) electronic grade sulfuric acid solution (6 bed volumes) was passed through a canister containing Amberlyst® 15 ion exchange resin (bed volume 0.25 cu.ft.) at a rate of 14 bed voumes per hour. Deionized water (60 bed volumes) was then allowed to pass through the canister at the same rate. The pH of the effluent water was measured to assure that it matched the pH of 6 for fresh deionized water.

ALS solution (15%, 900 lbs)) was processed through the canister to reduce metals, which also converted ALS to LS. The metals before and after processing are shown in the following table.

TABLE 1

| Samples | Amount (lbs) | Na (ppb) | pH |
|---|---|---|---|
| Control | — | 90,000 | ~5–6 |
| Drum #1 | 450 | 20,000 | ~1 |
| Drum #2 | 200 | 20,000 | ~1 |

The same canister was regenerated according to the procedure in example 1 and LS solution from Table 1 was passed through the canister. The metals data are shown in Table 2 below.

TABLE 2

| Samples | Amount (lbs) | Na (ppb) | pH |
|---|---|---|---|
| Control | — | 23,000 | 1.8 |
| Drum #1 | 250 | 3200 | ~0–1 |
| Drum #2 | 250 | 5600 | ~0–1 |

The canister was regenerated again and 350 lbs of LS was processed. The metal ion data are shown in Table 3 below.

TABLE 3

| Samples | Amount (lbs) | Na (ppb) | pH |
|---|---|---|---|
| Control | — | 172,000 | 1.8 |
| Drum #1 | 200 | 6400 | ~0–1 |
| Drum #2 | 150 | 1000 | ~0–1 |

The cleaned LS solution from Tables 1, 2, and 3 were combined in a 200 gal. reactor and ammonium hydroxide was added to make ALS of pH~7 to 8.

EXAMPLE 5

Example 4 was repeated and a fresh batch of 800 lbs of 15% ALS solution was processed. The metal ion data before and after processing are shown in Table 4 below.

TABLE 4

| Samples | Amount (lbs) | Na (ppb) | pH |
|---|---|---|---|
| Control | — | 90,000 | 1.8 |
| Drum #1 | 400 | 1,700 | 1.8 |
| Drum #2 | 400 | 2,000 | 1.8 |

EXAMPLE 6

Example 1 was repeated and 684 grams of a 15% solution of LS was treated. The metal ion data are shown in Table 5 below.

TABLE 5

| Sample # | Amount (g) | Bed Vol. (ml) | Na (ppb) |
|---|---|---|---|
| Control | — | — | >50,000 |
| #1 | 142 | 1.4 | <5 |
| #2 | 133 | 2.8 | 5 |
| #3 | 135 | 4 | 41 |
| #4 | 133 | 5.5 | 626 |
| #5 | 141 | 7.0 | 3274 |

EXAMPLE 7

Example 1 was repeated with a bigger column, bed Volume 530 ml. The data are shown in Table 6 below.

TABLE 6

| Sample # | Amount (g) | Bed Vol. (ml) | Na (ppb) |
|---|---|---|---|
| Control | — | — | >90,000 |
| 1 | 110 | — | 16 |
| 2 | 120 | — | 43 |
| 3 | 156 | — | 46 |
| 4 | 130 | 1.0 | 105 |
| 5 | 259 | — | — |
| 6 | 527 | 2.5 | — |
| 7 | 141 | — | 12 |
| 8 | 460 | 3.6 | 24 |
| 9 | 143 | — | 126 |
| 10 | 535 | 4.9 | >5000* |

*Note:
The column is exhausted after the 4th bed volume. Ammonium ion is exchanged and ALS is transferred to lauryl sulfate (LS).

EXAMPLE 8

Example 1 was repeated with 300 g of ALS solution (30% in water). 300 g of DI water was added and 30 g of 10% hydrochloric acid was added. The mixture was heated at 60° C. for an hour to remove carbonate. The resulting mixture was cooled to room temperature and was passed through a precleaned Amberlyst® 15 acidic ion exchange resin column, as described in Example 1, with 10 to 12 minutes residence time. The treated and untreated samples were tested for metal ions. Before treatment sodium was found to be >1000 ppb and iron >500 ppb, after treatment sodium was 161 ppb and iron was 39 ppb.

EXAMPLE 9

A developer was formulated using ALS solution from Example 8, as follows: 131.99 g ALS solution, 246.50 g of 25% TMAH, 3021.51 g of DI water were mixed. Another sample was formulated exactly the same way using ALS solution before treatment as control. Normality of the two samples were matched, as shown in the Table 7 below.

AZ® 1500 Photoresist (available from the AZ Photoresist Products division of Hoechst Celanese Corporation) was coated on a silicon wafer and softbaked for 50 seconds at 95° C. to a film thickness of 1.10 µm (micrometer), exposed on a GCA™ 0.38 NA g-line steeper and spray-puddle developed for 60 seconds at 21° C. The results of the comparison are shown in the Table 7 below.

TABLE 7

|  | R1 | R2 | R3 | Eo | DTP |
|---|---|---|---|---|---|
| Control | 0.230N | 0.266N | 0.269N | 54 | 70 |
| Sample | 0.229 | 0.266 | 0.269 | 62 | 80 |

R1, R2, R3=Normality values
Eo=Dose to clear, $mJ/cm^2$
DTP=Dose to print, $mJ/cm^2$ EXAMPLES 10 and 11

Example 9 was repeated using ALS solution from Example 4 and was tested for metal ions. The results are shown in Table 8 below.

TABLE 8

| Metal Ions | Example 10 (ppb) | Example 11 (ppb) |
|---|---|---|
| Na | 800 | 70 |
| Fe | <6 | 2 |
| Ca | 100 | 20 |
| K | 40 | <10 |
| Mg | 3 | <2 |
| Ag | <6 | <6 |
| Pb | <10 | <10 |
| Zn | 6 | 2 |
| Cu | <6 | <6 |

What is claimed:

1. A process for producing a developer containing a surfactant having a very low level of metal ions, which comprises:

a) washing an acidic ion exchange resin with deionized water, followed by a mineral acid solution and thereby reducing the level of sodium and iron ions in the acidic ion exchange resin to less than 200 ppb each;

b) providing a solution of 1 to 35 weight percent of a surfactant in a deionized solvent;

c) passing the surfactant solution of b) through the acidic ion exchange resin of a) and thereby reducing the level of sodium and iron ions in the surfactant solution to no more than 1,000 ppb each;

d) adding an aqueous base to the deionized solution to adjust the pH to from about 7 to 8;

e) formulating a developer composition by providing an admixture of:

(1) the acidic ion exchange resin treated surfactant solution in a deionized solvent; and (2) mixing the surfactant solution of e) (1) with a metal ion free developer.

2. The process of claim 1 wherein after step a), the acidic ion exchange resin is treated with a solvent which is the same as, or at least compatible with, the solvent for the surfactant which is to be treated with the acidic ion exchange resin.

3. The process of claim 2 after step c) wherein the acidic ion exchange resin is treated with sufficient new solvent to substantially remove other solvents and to saturate the acidic ion exchange resin with the new solvent.

4. The process of claim 1 wherein the deionized solvent is selected from the group consisting of water, ethanol and a water/ethanol mixture.

5. The process of claim 1 wherein the developer is an ammonium hydroxide.

6. The process of claim 5 wherein the developer is tetramethyl ammonium hydroxide.

7. The process of claim 1 wherein the surfactant is ammonium lauryl sulfate.

8. The process of claim 1 wherein the developer composition has a sodium and iron ion level of less than 200 ppb each.

* * * * *